United States Patent [19]
Veltri et al.

[11] Patent Number: 4,500,483
[45] Date of Patent: Feb. 19, 1985

[54] MANUFACTURE OF HOLLOW CVD SILICON NITRIDE ARTICLES

[75] Inventors: Richard D. Veltri, East Hartford; Francis S. Galasso, Manchester, both of Conn.; Mel I. Mendelson, Palm Beach Gardens, Fla.

[73] Assignee: United Technologies Corporation, Hartford, Conn.

[21] Appl. No.: 379,827

[22] Filed: Mar. 19, 1982

[51] Int. Cl.$^3$ ............................................. B29C 13/00
[52] U.S. Cl. ..................................... 264/81; 427/227; 427/255.2; 427/289
[58] Field of Search ............... 427/255.2, 227, 289, 427/398.5; 264/81

[56] References Cited

U.S. PATENT DOCUMENTS

| | | | |
|---|---|---|---|
| 3,226,194 | 12/1965 | Kuntz | 264/81 |
| 3,565,674 | 2/1971 | Boland et al. | 264/81 |
| 4,035,460 | 7/1977 | Dietz et al. | 264/81 |
| 4,036,653 | 7/1977 | Jacobson | 106/47 R |
| 4,289,801 | 9/1981 | Galasso et al. | 427/94 |

Primary Examiner—Norman Morgenstern
Assistant Examiner—Janyce A. Bell
Attorney, Agent, or Firm—Charles A. Warren

[57] ABSTRACT

The process of making an article of chemically vapor deposited silicon nitride on a pattern at high temperature including the use of methane to reduce the grain size of the deposited compound.

5 Claims, 4 Drawing Figures

MANUFACTURE OF HOLLOW CVD SILICON NITRIDE ARTICLES

TECHNICAL FIELD

A hollow ceramic article for use in very high temperature environments is made from silicon nitride by chemical vapor deposition.

BACKGROUND ART

Although silicon nitride shapes made by CVD have been in use for years they are invariably solid rather than hollow and no extensive study has been made of hollow shapes of this type of article. Moreover these materials generally contain large grains and are, therefore, weak especially in directions perpendicular to the direction of deposition of the compound.

DISCLOSURE OF INVENTION

A feature of the invention is the production of hollow shapes of chemically vapor deposited silicon nitride in which the grain size is relatively small for the purpose of improving the strength.

Another feature is the use of methane during the vapor deposition to produce the desired grain size in the completed hollow article. U.S. Pat. No. 4,289,801 describes the use of methane in the production of pyrolytic silicon nitride. However, this concept has not been utilized in the manufacture of hollow silicon nitride parts until the present invention.

Another feature is a hollow shape of chemical vapor deposited silicon nitride in which the entire article in its finished form is only the silicon nitride material.

According to the invention a shaped substrate or pattern is formed from a suitable material such as carbon and this pattern is then heated to about 1450° C. in a furnace into which a gaseous silicon halide and ammonia are introduced. The silicon halide and the ammonia combine to produce silicon nitride which is deposited on the pattern. After keeping the pattern in this high temperature environment for several hours, a surface coating of the silicon nitride is formed on the pattern.

Removal of the pattern is accomplished by heating the structure in air at a temperature below that at which the silicon nitride will be damaged. The coating is now the complete structure of the article, and its thickness is controlled by the time that the shape or pattern is kept in the gaseous environment above described. More specifically, silicon nitride is deposited on the pattern in this way and is treated during the deposition by adding methane as a gas to the combination of the silicon halide and ammonia gases in which the pattern is positioned.

The foregoing and other objects, features and advantages of the present invention will become more apparent in the light of the following detailed description of the preferred embodiments thereof as shown in the accompanying drawing.

BEST MODE FOR CARRYING OUT THE INVENTION

Figure 1:
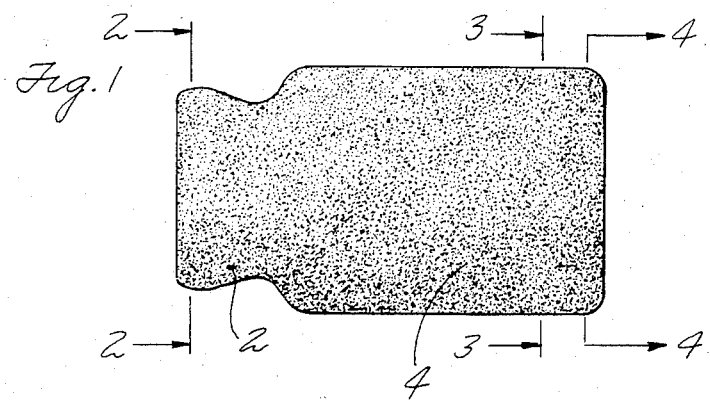
FIG. 1 is a plan view of a ceramic article more specifically a ceramic blade according to the invention.
Figure 2:
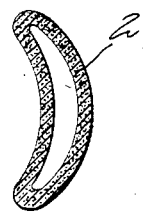
FIG. 2 is a sectional view along the line 2—2 of FIG. 1.
Figure 4:
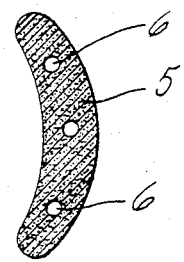
FIG. 4 is an end view looking in the direction of the arrow 4 of FIG. 1.
Figure 3:
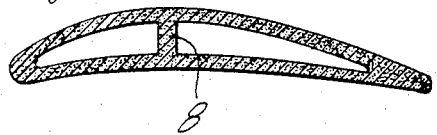
FIG. 3 is a sectional view along the line 3—3 of FIG. 1.

As shown in the drawing the article to be made is represented as a turbine blade which has a root portion 2 shown in section in FIG. 2 and an airfoil portion 4, a section of which is shown in FIG. 3. At the tip 5 of the blade holes 6 therein permit escape of cooling air passing through the blade when the latter is in use. The airfoil portion may have a transverse web 8 therein for greater strength. The article is hollow throughout its length as will be apparent.

To produce the blade a shaped substrate or pattern was made from a suitable material such as carbon so that it may be burned out of the finished blade to leave a finished article that is entirely silicon nitride. This pattern will obviously be smaller in dimension than the finished blade by a dimension comparable to the blade wall thickness desired as will be apparent. The pattern has a root shape similar to the opening in the blade root of FIG. 2 and an airfoil shape similar to the hollow of FIG. 3. The airfoil part of the pattern may have a slot therein to produce the web of FIG. 3 during the blade forming process.

The blade pattern is suspended in a suitable furnace, preferably a carbon resistance furnace and heated to a temperature of 1400° to 1500° C., preferably 1450° C. In making the silicon nitride blade, silicon tetrafluoride and ammonia gases are introduced to the furnace and this atmosphere and temperature are maintained for several hours, preferably between eight and eleven and more specifically, ten hours. The mixture of silicon tetrafluoride and ammonia gases is proportioned so as to combine and form silicon nitride which is deposited on the blade pattern. The percentages are preferably silicon tetrafluoride 25% and ammonia 75%. For a thicker wall of the finished blade the time of deposition will be increased as will be apparent. Blades have been made by maintaining the coating process in this coating environment for as much as 40 hours when a relatively thick wall for the finished blade is desired.

After the coating process is completed the blade is removed from the furnace and the coating is polished off the root end of the pattern to provide an open end as will be apparent and the holes 6 are formed through the coating at the tip. The carbon pattern is then burned out of the finished blade by heating in air at between 650° C. and 780° C., preferably about 700° C. for several hours, for example, twelve hours. The open ends of the blade allow the escape of the $CO_2$ formed during removal of the pattern. The effect of this is to remove the carbon pattern completely without damaging the structure of the coating itself, which now becomes the total structural element of the blade. The result of removing the carbon is a finished blade, the wall of which is silicon nitride and of the desired thickness to perform its function when later utilized in a turbine. In a coating process time of ten hours the wall thickness becomes about 9 mils. This is quite thin but has the desired strength for the particular purpose for which it is made.

To improve the strength properties by reducing the grain size of the silicon nitride the coating is applied in the same atmosphere as above described except that methane or other gaseous source of carbon is added with the silicon tetrafluoride and ammonia mixture. The proportion of methane is 50 to 500% of methane to the sum of the gas mixture of silicon tetrafluoride and ammonia. The times of coating will be much the same as above and obviously the time is determined by the desired thickness of the coating. The grain size that results in the use of methane is significantly reduced which should result in an increase in the strength of the blade longitudinally, that is to say, at right angles to the direction of deposition. The resulting silicon nitride structure is dark and crystalline. Although the silicon nitride may vary from white to nearly black it is normally quite dark when deposited on a curved surface and is a dark material when high ammonia/silicon tetrafluoride ratios are used.

The final product is a hollow blade of silicon nitride having a longitudinal passage therein for cooling air and the walls of which are a silicon nitride crystalline structure, the individual crystals of which are relatively small in order to provide the desired strength in a direction longitudinally of the blade, that is, at right angles to the direction of grain deposition. The use of methane has assured the desired small grain structure without affecting the chemical composition of the blade or without otherwise affecting the process by which the blade is made. It will be understood that the resulting finished product with the pattern burned out, consists solely of silicon nitride and is, therefore, capable of being used at a relatively high temperature without damage to the structure and without failure of the blade. More specifically the particular blade having the most utility is a silicon nitride blade having a wall thickness to produce adequate stength for the purpose to which the blade is to be used. The small grain size which enhances the strength of the blade to an adequate degree is produced by the use of methane as a gas mixed with the gases which combine to form silicon nitride that is deposited by chemical vapor deposition on the pattern. Although it is known to use methane in a coating process, it is believed novel to use the methane in producing a hollow product that is entirely the small crystalline silicon nitride with no reinforcing substrate.

Although the invention has been shown and described with respect to a preferred embodiment thereof, it should be understood by those skilled in the art that other various changes and omissions in the form and detail thereof may be made therein without departing from the spirit and the scope of the invention.

We claim:

1. In the manufacture of a hollow article of silicon nitride the steps of:
    making a carbon pattern for the article;
    heating the pattern to between 1400° and 1500° C. in a gaseous atmosphere of silicon tetrafluoride and ammonia to combine with the silicon tetrafluoride and ammonia and to deposit a coating of silicon nitride on the pattern;
    removing the pattern and coating from the gaseous atmosphere;
    removing an area of the coating to form an opening to expose the pattern; and
    burning out the pattern by heating the coated pattern to between 650° and 750° C. in an oxidizing atmosphere for several hours to cause reaction of the carbon with the oxygen in the atmosphere.

2. A process for manufacturing a hollow article of a silicon nitride as in claim 1 including the additional step of forming holes at opposite ends of the completed structure to provide for a flow of cooling air through the structure.

3. The process of making a hollow article of silicon nitride as in claim 1 in which methane is added to the mixture of silicon tetrafluoride and ammonia during the coating of the substrate to produce a smaller grain size in the deposited compound.

4. In the manufacture of a hollow blade of silicon nitride the steps of:
    making a carbon pattern for the blade;
    heating the pattern to a temperature between 1400° and 1500° C. in a gaseous atmosphere of silicon tetrafluoride and ammonia to which methane is added;
    depositing the silicon nitride from the gases onto the pattern;
    removing the pattern with its coating from the gaseous atmosphere;
    removing an area of the coating from the pattern to form an opening to expose the pattern; and
    burning out the pattern by heating the coated pattern to 700° C. in air for several hours until the pattern has been removed.

5. The process of claim 4 in which holes are formed at opposite ends of the blade before the burning out step.

* * * * *